June 10, 1958 R. B. TROUSDALE 2,838,674

OSCILLATOR CONTROL CIRCUIT

Filed March 18, 1955

INVENTOR.

BY Robert B. Trousdale

T. L. Bowes

ATTORNEY

United States Patent Office 2,838,674

Patented June 10, 1958

2,838,674

OSCILLATOR CONTROL CIRCUIT

Robert B. Trousdale, Webster, N. Y., assignor, by mesne assignments, to General Dynamics Corporation, a corporation of Delaware Application March 18, 1955, Serial No. 495,288

9 Claims. (Cl. 250—36)

The present invention relates to oscillator control circuits, and, more particularly, to a circuit for automatically controlling the frequency of an electrical oscillator wherein anti-hunt facilities are provided to stabilize the oscillator control circuit. While the invention is of general utility for electrical oscillators, the invention is particularly adapted for use with and will be described in connection with a ringing frequency generator arrangement of the type disclosed in Wheeler patent No. 2,679,014, which issued May 18, 1954 and is assigned to the same assignee as the present invention.

In the ringing frequency generator arrangement disclosed in the above identified Wheeler patent, a plurality of electrical oscillators are controlled in accordance with signals derived from a common source of reference frequency such as a tuning fork or the like. If the individual oscillators are energized from a voltage source which fluctuates in a random manner, the control networks which are employed to control the frequency of the oscillators must function to correct for the fluctuations of the source of energizing potential. In many instances the control network employed with the oscillator incorporates an integration circuit to remove undesired low frequency components and these integration networks are of relatively long time constant with the result that the controlled oscillator may operate at a frequency which is considerably in error until the large condensers of the anti-hunt network have been recharged to the new voltage level.

It is, therefore, an object of the present invention to provide a new and improved control circuit for an oscillator wherein compensation is made for fluctuations of the voltage source which energizes the controlled oscillator.

It is another object of the present invention to provide a new and improved control circuit for an oscillator wherein anti-hunt facilities are provided while providing compensation for fluctuations of the voltage source which controls the oscillator.

It is a further object of the present invention to provide a new and improved control circuit for an electrical oscillator wherein an integration network of relatively long time constant is provided and facilities are provided for substantially instantaneously modifying the charge on one or more of the condensers in the integration network in direct response to fluctuations of the voltage supply which energizes the controlled oscillator.

Figure 1:
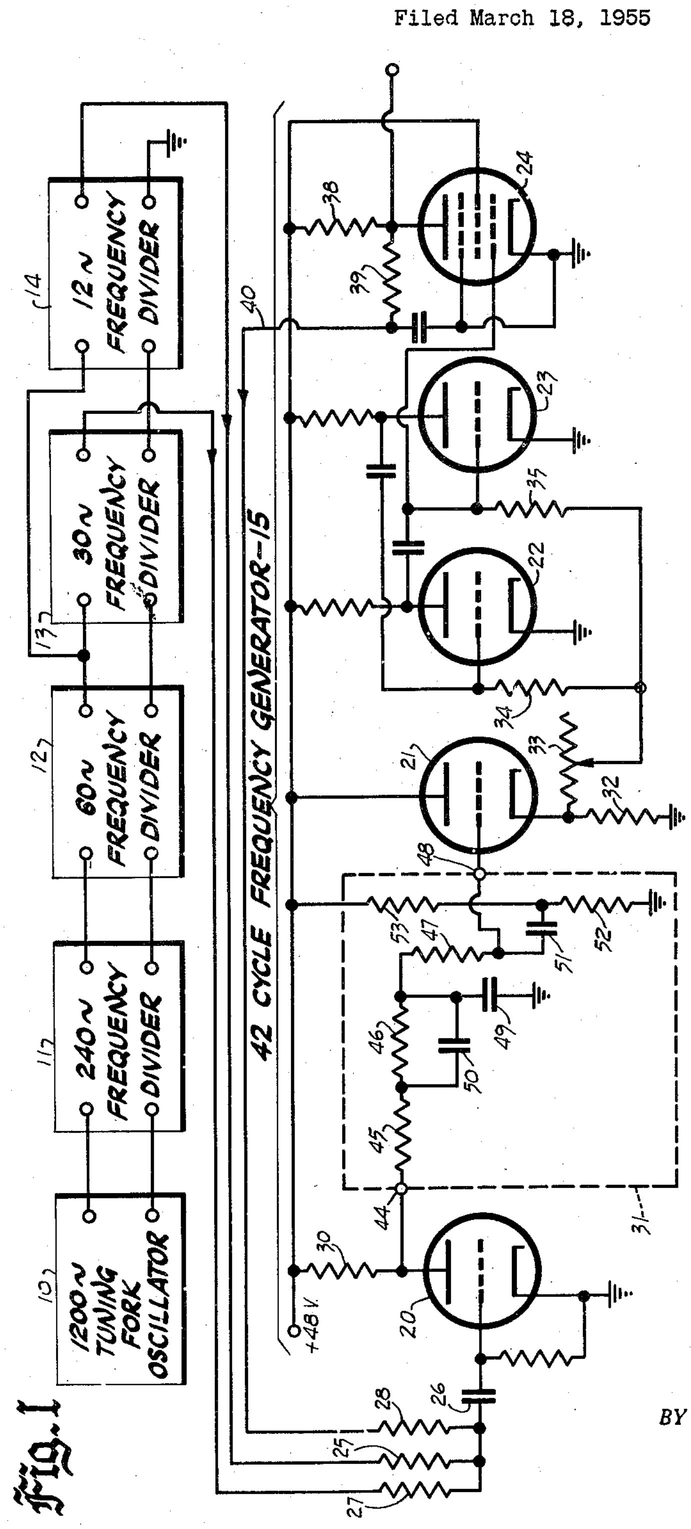
Figure 4:
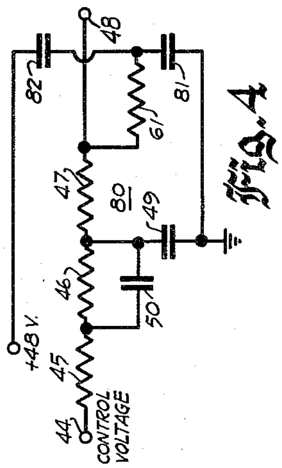
Figure 3:
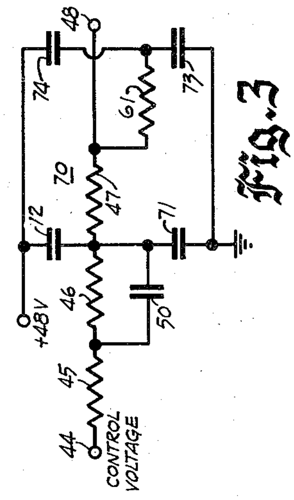
Figure 2:
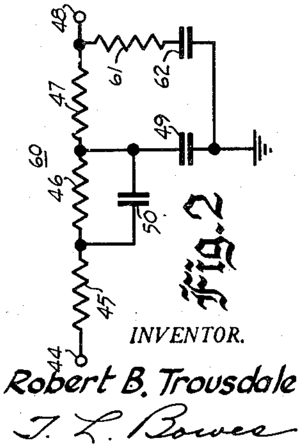

The invention, both as to its organization and method of operation, together with further objects and advantages thereof, will best be understood by reference to the following specification taken in connection with the accompanying drawings, in which:

Fig. 1 is a schematic diagram, partly in block diagram form, of an oscillator control arrangement embodying the principles of the present invention; and Figs. 2, 3 and 4 are alternative embodiments of the control circuit network which may be employed in the oscillator system of Fig. 1.

Referring now to the drawing, and more particularly to Fig. 1 thereof, the oscillator control circuit of the present invention is therein illustrated in conjunction with a ringing frequency generator wherein a plurality of different frequencies are developed which are suitable for exciting the ringing facilities of multiparty subscriber lines in a telephone system. More particularly, a 1200 cycle tuning fork oscillator 10 is provided as a source of substantially constant reference voltage and the output of the oscillator 10 is employed to control a 240 cycle frequency divider 11. The output of the divider 11 controls a 60 cycle frequency divider 12 which, in turn, controls a thirty cycle frequency divider 13 and a 12 cycle frequency divider 14. In the illustrated embodiment the output of the 30 cycle frequency divider 13 and the 12 cycle frequency divider 14 are employed to control jointly the frequency of a 42 cycle frequency generator 15 to be described in more detail hereinafter. However, it will be understood that other frequency dividers may be employed to control other frequency generators in the manner described in detail in the above identified Wheeler patent No. 2,679,014 so that a series of ringing frequencies, such as the conventional synchromonic series, is provided.

Considering now the frequency generator 15, there is provided a phase detector tube 20, a cathode follower tube 21, a pair of tubes 22 and 23 which are interconnected to form a conventional multivibrator circuit, and an output tube 24. A 12 cycle output signal from the divider 14 is coupled through the mixing resistor 25 and the condenser 26 to the control grid of the phase detector tube 20 and a 30 cycle signal from the divider 13 is coupled through the resistor 27 and the condenser 26 to the control grid of the tube 20. A 42 cycle output signal, which is derived from the anode circuit of the output tube 24, is coupled through the mixing resistor 28 and the condenser 26 to the control grid of the tube 20. The tube 20 is operated at zero bias D. C. and a direct current error voltage is produced at the anode thereof which is proportional to the phase difference between the 42 cycle output of the generator 15 and combined frequency outputs of the 30 cycle divider 13 and the 12 cycle divider 14. On the positive portions of the composite voltage applied to the grid of the tube 20, the condenser 26 is charged by flow of grid current so that a negative D. C. bias is developed which prevents the tube 20 from conducting except during selected positive portions of the composite wave.

In the illustrated embodiment all of the tubes of the frequency generator 15 are energized from a 48 volt D. C. supply which is conventionally employed in electromechanical telephone systems. The 48 volt supply is connected to the anode of the tube 20 through the load resistor 30. The error or control voltage which is developed across the resistor 30 is coupled through a network indicated generally at 31, which provides anti-hunt action, i. e. permits a relatively high system gain to be employed without producing hunting, instability or sustained oscillation of the system, and also compensates for fluctuations in the 48 volt supply in a manner to be described in more detail hereinafter, to the control grid of the cathode follower tube 21, and is repeated in like phase across the cathode resistor 32 of this tube. A variable resistor 33 is connected between the cathode of the tube 21 and the common connection of the grid resistors 34 and 35 of the tubes 22 and 23, respectively, so as to control the frequency of the square wave developed by these tubes. In this connection it will be understood that the anodes and control grids of the tubes 22 and 23 are cross connected to form a conventional multivibrator circuit the frequency of which may be controlled by varrying the D. C. voltages applied to the control grids of these tubes. A 42 cycle square wave is derived from the grid of the tube 23 and is directly connected to the control grid of the output tube 24 so as to develop a corresponding 42 cycle square wave across the anode resistor 38 of this tube. A 42 cycle feedback voltage is coupled through the resistor 39, over the conductor 40 and through the resistor 28 and the condenser 26 to the control grid of the phase detector tube 20.

Considering now in more detail the control network 31 which is employed to provide an anti-hunt function and voltage supply compensation, the control voltage developed at the anode of the tube 20 is coupled from the input terminal 44 through three series connected resistors 45, 46 and 47 to the output terminal 48 of the network 31. A condenser 49 which is connected from the junction point of the resistors 46 and 47 to ground, forms an integration network with the resistor 45 which integration network has a relatively long time constant so as to remove any six cycle per second component of the error signal which is developed at the anode of the tube 20. A condenser 50 is connected in parallel with the resistor 46 so as to provide increased gain for the higher frequencies. A condenser 51 and resistor 52 are connected in series from the output terminal 48 to ground, a resistor 53 is connected from the junction point of the condenser 51 and the resistor 52 to plus forty-eight volts and the resistors 47, 52 and 53 and the condenser 51 form a phase shifting network. Since the phase detector circuit introduces a phase shift of approximately 90 degrees and the integration network introduces an additional phase shift in the same direction which approaches 90 degrees at the higher frequencies, it will be evident that the control loop will be regenerative unless an additional phase shift in the opposite direction is introduced into the control network. Accordingly, the resistors 47, 52 and 53 and the condenser 51 are so chosen that they produce a phase shift in the opposite direction which approaches 90 degrees at unity gain for the system so that oscillation and instability of the system are not produced.

In considering the manner in which the network 31 provides compensation for fluctuations of the 48 volt supply, reference may first be had to Fig. 2 wherein a similar network 60 is shown which does not provide voltage supply compensation. In the network 60 of Fig. 2 corresponding elements have been given the same reference numerals as in Fig. 1. Thus, referring to Fig. 2 the network 60 is not controlled in accordance with variations in the 48 volt supply but instead a resistor 61 and condenser 62 are connected from the output terminal 48 to ground to provide, with the resistor 47, the desired phase shift as described immediately above. When the network 60 is employed in the generator 15 and the 48 volt supply voltage changes abruptly, the frequency of the multivibrator varies considerably with the result that a substantial error signal is developed at the anode of the tube 20. Since the network 60 includes the relatively large shunt connected condensers 49 and 62, a considerable time is required to charge these condensers to the new voltage level.

In order to provide compensation for fluctuations of the 48 volt supply, the network 60 of Fig. 2 may be modified as shown in Fig. 3 wherein the modified network is identified by the reference numeral 70. In Fig. 3 elements which correspond to the networks of Figs. 1 and 2 have been given the same reference numerals. In Fig. 3 the condenser 49 of the network 60 has been replaced by two condensers 71 and 72, the condenser 71 being connected from the junction point of the resistors 46 and 47 to ground and the condenser 72 being connected from this junction point to the 48 volt supply. For a given percentage change in the voltage of the 48 volt supply, it has been found that the control voltage which is supplied to the input terminal 44 of the network varies by a directly proportional amount. Accordingly, the values of the condensers 71 and 72 are so chosen that the correct proportional change in control voltage is substantially immediately effected by connection to the 48 volt supply. Furthermore, the values of the condensers 71 and 72 are so chosen that their sum is equal to the capacitance of the condenser 49 in the network 60 so that the same A. C. impedance is produced in the network. For example, if the condenser 49 has a value of 0.1 microfarads and the control voltage impressed upon the terminal 44 has an average value of 20 volts, the condenser 72 is chosen to have a value of 0.0417 microfarads and the condenser 71 is chosen to have a value of 0.0583 microfarads so that the ratio of the capacitors 72 and 71 is equal to 20/28. In a similar manner, the condenser 62 in the network 60 is replaced by the condensers 73 and 74 in the network 70 which have a total parallel capacity equal to the capacity of the condenser 62 and have individual capacities in accordance with the ratio 20/28.

When the voltage of the 48 volt supply changes, the condensers 71, 72, 73 and 74 are substantially instantaneously charged to the new voltage level and since the capacities of these condensers are chosen in the correct ratio, corresponding to the ratio of the 48 volt supply to the average value of the control voltage, the control signal developed at the output terminal 48 of the network 70 is brought almost instantaneously to the desired ultimate value. As a result, the control loop is only called upon to correct for slight errors in the proportioning of the above described capacitative voltage dividers and substantially immediate correction for voltage fluctuations of the 48 volt supply are provided.

In Fig. 4 there is shown a modified network indicated generally at 80, wherein the network 70 is somewhat simplified while retaining the advantages of supply voltage compensation discussed in detail above in connection with the network 70. Referring to Fig. 4, compensation for the condenser 49 is eliminated therein by overcompensating for the condenser 62 of the network 60. More particularly, there is provided the condensers 81 and 82 which are connected in the network 80 in the manner corresponding to the condensers 73 and 74 of the network 70. However, the values of the condensers 81 and 82 are chosen with a different capacity ratio such that sufficient overcompensation is produced to correct for the charging time required to recharge the condenser 49 to the new voltage level. In the illustrated embodiment, wherein the average value of the control voltage is 20 volts and the condenser 62 in the network 60 has a value of 0.5 microfarads, the condensers 81 and 82 each have a capacity value of 0.25 microfarads, so that a one to one ratio is provided instead of the 20/28 ratio employed in Fig. 3. With a one to one ratio of the condensers 81 and 82 in Fig. 4 sufficient overcompensation is produced so that only very slight variations in the error corrections are required due to fluctuations of the 48 volt supply.

The network 31 of Fig. 1 constitutes a further simplification from the network 80 of Fig. 4 in that voltage compensation is provided by a resistive type voltage divider network instead of the capacitative divider networks of Figs. 3 and 4. Thus, in the network 31, the condenser 51 has a value equal to the condenser 62 of the network 60 and the resistors 52 and 53 have a total parallel resistance equal to the resistor 61 in the network 60. In this connection it will be understood that the condenser 51 and the resistors 52 and 53 are equivalent electrically to the resistor 61 and the condensers 81 and 82 in the network 80 shown in Fig. 4.

By way of example, and not in any sense as a limitation to the particular values given, an anti-hunt and voltage supply compensation network constructed in accordance with the present invention has been found satisfactory to synchronize ringing frequency generators of 42 cycle, 54 cycle and 66 cycle frequencies while providing voltage compensation for fluctuations of a 48 volt supply. In a specific embodiment, the tubes 20, 21, 22 and 23 are of the commercial type 12AU7 and the tube 24 is of the commercial type 5OC5. Other circuit constants employed in the network 31 are as follows:

| | | |
|---|---|---|
| Resistor **45** | megohms | 1.5 |
| Resistor **46** | do | 4.7 |
| Resistor **47** | ohms | 510,000 |
| Resistor **52** | megohms | 2.0 |
| Resistor **53** | do | 2.0 |
| Condenser **50** | mfd | 0.1 |
| Condenser **49** | mfd | 0.1 |
| Condenser **51** | mfd | 0.5 |

While there have been described what are at present considered to be the preferred embodiments of the invention, it will be understood that various modifications may be made therein which are within the true spirit and scope of the invention as defined in the appended claims.

What is claimed as new and desired to be secured by Letters Patent of the United States is:

1. A control circuit for controlling the frequency of an oscillator, comprising a source of energizing potential connected to said oscillator, a source of synchronizing voltage, means for deriving a feedback signal from said oscillator, means for combining said synchronizing voltage and said feedback signal to produce a control signal, means including an anti-hunt network for controlling the frequency of said oscillator in accordance with said control signal, said anti-hunt network including at least one capacitive element, and means for charging said capacitive element substantially instantaneously in proportion to said source of energizing potential, thereby to compensate for fluctuations of said source of energizing potential.

2. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an integration network having at least one capacitive element for controlling the frequency of said oscillator in accordance with said control signal, and means including a condenser connected between said capacitive element and said source of energizing potential for varying the charge on said capacitive element in accordance with fluctuations of said source of energizing potential and independently of said integration network.

3. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network having an integration network including a series connected resistor and a shunt connected first condenser, and a second condenser connected between said first condenser and said source of energizing potential, said first and second condensers having capacities the ratio of which is substantially equal to the ratio of the average value of said control signal to said source of energizing potential.

4. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including first and second shunt connected condensers, a third condenser connected between said first condenser and said source of energizing potential, and a fourth condenser connected between said second condenser and said source of energizing potential, said first and third condensers and said second and fourth condensers having capacities the ratios of which are substantially equal to the ratio of the average value of said control signal to said source of energizing potential.

5. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including first and second shunt connected condensers, and a third condenser connected between one of said first and second condensers and said source of energizing potential, said third condenser having a capacity value relative to said first and second condensers such that fluctuations in said source of energizing potential are compensated by said third condenser.

6. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including a first condenser, means including a resistor for charging said condenser in proportion to said control signal, and means including a second condenser for charging said first condenser in proportion to fluctuations of said source of energizing potential, the sum of the capacities of said first and second condensers and said resistor forming an integration network having a predetermined time constant.

7. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including a shunt branch having a resistor and condenser connected in series, and means including an impedance connected between said source of energizing potential and the junction point of said resistor and condenser for compensating for fluctuations of said source of energizing potential.

8. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including a shunt branch having a resistor and condenser connected in series, and means including an impedance connected between said source of energizing potential and the junction point of said resistor and condenser for compensating for fluctuations of said source of energizing potential, said resistor and condenser and said impedance having a predetermined network time constant.

9. A control circuit for controlling the frequency of an oscillator, comprising a source of energizing potential connected to said oscillator, a source of synchronizing voltage, means for deriving a feedback signal from said oscillator, phase detector means for developing a control signal proportional to the relative phase of said feedback signal and said synchronizing voltage, means including an anti-hunt network for controlling the frequency of said oscillator in accordance with said control signal, said anti-hunt network including a first resistive-capacitive branch circuit connected between said phase detector means and a point of fixed potential and a second resistive-capacitive branch circuit connected between said source of energizing potential and said point of fixed potential, said first and second branches having a common impedance element and said first and second branches together having a predetermined network time constant.

References Cited in the file of this patent

UNITED STATES PATENTS

| | | |
|---|---|---|
| 2,598,370 | Gruen | May 27, 1952 |
| 2,743,364 | Kraft | Apr. 24, 1956 |
| 2,764,681 | Howell | Sept. 25, 1956 |